(12) United States Patent
Chen et al.

(10) Patent No.: US 9,502,373 B2
(45) Date of Patent: Nov. 22, 2016

(54) LID ATTACH PROCESS AND APPARATUS FOR FABRICATION OF SEMICONDUCTOR PACKAGES

(71) Applicant: TAIWAN SEMICONDUCTOR MANUFACTURING COMPANY, LTD., Hsinchu (TW)

(72) Inventors: Chin-Liang Chen, Hsinchu (TW); Wei-Ting Lin, Taipei (TW); Yu-Chih Liu, Taipei (TW); Kuan-Lin Ho, Hsinchu (TW); Jason Shen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/543,307

(22) Filed: Nov. 17, 2014

(65) Prior Publication Data

US 2015/0069089 A1 Mar. 12, 2015

Related U.S. Application Data

(62) Division of application No. 13/494,814, filed on Jun. 12, 2012, now Pat. No. 8,916,419.

(60) Provisional application No. 61/617,383, filed on Mar. 29, 2012.

(51) Int. Cl.
*H01L 23/00* (2006.01)
*H01L 21/56* (2006.01)

(52) U.S. Cl.
CPC ............. *H01L 24/743* (2013.01); *H01L 21/56* (2013.01); *H01L 24/27* (2013.01); *H01L 24/75* (2013.01); *H01L 21/565* (2013.01); *H01L 2224/16225* (2013.01); *H01L 2224/32225* (2013.01); *H01L 2224/73204* (2013.01); *H01L 2224/73253* (2013.01); *H01L 2224/75611* (2013.01); *H01L 2924/16152* (2013.01)

(58) Field of Classification Search
None
See application file for complete search history.

(56) References Cited

U.S. PATENT DOCUMENTS

| | | | |
|---|---|---|---|
| 5,187,123 A * | 2/1993 | Yoshida et al. | 156/295 |
| 7,993,984 B2 * | 8/2011 | Yokota et al. | 438/127 |
| 2003/0068487 A1 | 4/2003 | Nguyen et al. | |
| 2005/0172891 A1 * | 8/2005 | Suzuki et al. | 118/300 |
| 2008/0044576 A1 | 2/2008 | Colbert et al. | |
| 2008/0053323 A1 * | 3/2008 | Karlosky | 101/171 |
| 2008/0142960 A1 | 6/2008 | Leal et al. | |
| 2009/0166890 A1 | 7/2009 | Chrysler et al. | |
| 2011/0114258 A1 | 5/2011 | Chau et al. | |
| 2011/0241161 A1 | 10/2011 | Tosaya et al. | |

* cited by examiner

*Primary Examiner* — Charles Garber
*Assistant Examiner* — Brigitte Paterson
(74) *Attorney, Agent, or Firm* — Hauptman Ham, LLP

(57) ABSTRACT

An adhesive dispenser comprises a dispensing head. The dispensing head comprises an adhesive material applicator portion on a first level of the dispensing head. The adhesive material applicator portion corresponds to a periphery of a package. The dispensing head also comprises a thermal interface material (TIM) applicator portion on a second level of the dispensing head different from the first level. The TIM applicator portion corresponds to a die of the package. The dispensing head further comprises an adhesive material conduit configured to supply the adhesive material applicator portion with an adhesive material. The dispensing head additionally comprises a TIM conduit configured to supply the TIM applicator portion with a TIM.

20 Claims, 5 Drawing Sheets

LID ATTACH PROCESS AND APPARATUS FOR FABRICATION OF SEMICONDUCTOR PACKAGES

PRIORITY CLAIM

The present application is a divisional of U.S. application Ser. No. 13/494,814, filed Jun. 12, 2012, now U.S. Pat. No. 8,916,419, issued Dec. 23, 2014, which claims priority of U.S. Provisional Patent Application No. 61/617,383, filed Mar. 29, 2012, which are incorporated herein by reference in their entireties.

FIELD

The disclosure relates generally to the fabrication of semiconductor packages, and more particularly, to a high throughput and accurate lid attach process and apparatus.

BACKGROUND

The assembly of a semiconductor package plays an important role in semiconductor fabrication and thermal management. A conventional semiconductor package includes a lid, one or more die, seal adhesive, interconnects, a substrate, and/or a thermal interface material (TIM).

The die is placed on the substrate through a die-attach process. Typically, the die-attach process involves attaching a flip-chip type die to the substrate by interconnects through a reflow process. In a lid attach process, the seal adhesive is dispensed on a periphery of the substrate by a needle-type dispensing head, for example, for attaching the lid later. The TIM is applied to a bottom side of the die (i.e., the side opposite the interconnects) by the needle-type dispensing head. An underfill may be applied to the interconnects, the die, and the substrate to at least reduce stress to the semiconductor package. The lid is thereafter placed on the substrate, typically making contact with the seal adhesive and the die by way of the TIM.

In the conventional lid attach process, the needle-type dispensing head is often used for both dispensing the seal adhesive and the TIM. The seal adhesive and TIM are typically contained in a container such as a flask or vial and dispensed through tubes in the needle-type dispensing head by capillary action. There are disadvantages, however in dispensing either the seal adhesive or TIM via the needle-type dispensing head process. For large or small die applications, the throughput can be reduced due to the time needed to apply complicated TIM dispensing patterns to the die. FIG. 1 is a plan view of a semiconductor package undergoing a stage of fabrication where a complicated dispensing pattern 10 has been applied to a top of the die 20. Further, the seal adhesive may be improperly dispensed on the substrate. These may cause voids on the substrate or the seal adhesive may shift from the correct dispensing pattern 10 thereby compromising the integrity of the semiconductor package. FIG. 1 shows an example of seal adhesives 30 applied on the periphery of substrate 70 and a seal adhesive 40 that has shifted from its intended location 50. Further still, in the needle-type dispensing process, the dispensing pattern and weight may be difficult to control leading to insufficient TIM coverage on the die or insufficient adhesive coverage on the substrate.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration. For convenience of illustration and ease of understanding, the features and dimensions of the semiconductor package have been exaggerated in some aspects. However, one skilled in the art will appreciate that, in an actual device, these features may have relative dimensions that are different from those suggested in the figures.

Figure 1:
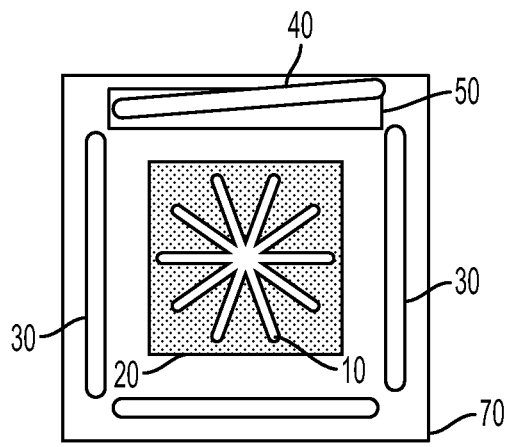
FIG. 1 is a plan view of a semiconductor package showing a dispensing pattern applied to the top of a die.
Figure 2A:
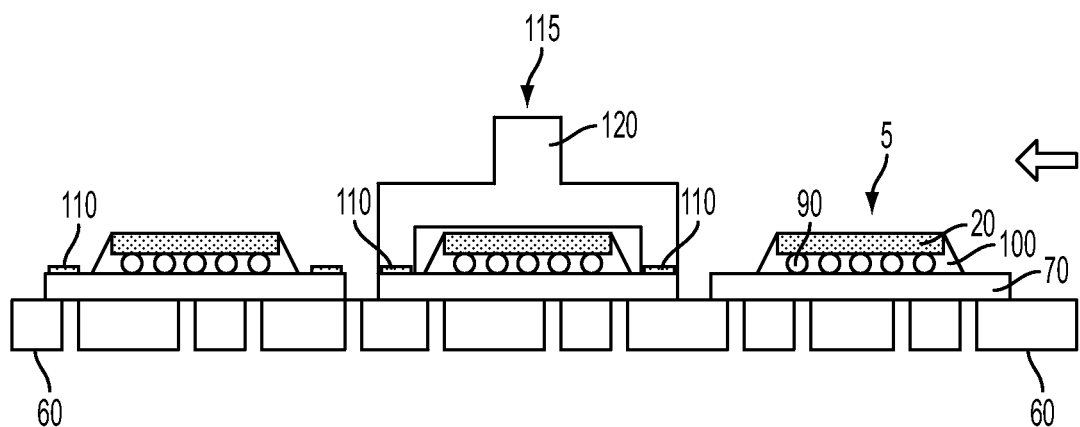
FIG. 2a is a cross-sectional view of a semiconductor package having a die attached to a substrate undergoing a stage of lid attachment where adhesive material is attached to the substrate, according to aspects of the present disclosure.
Figure 3A:
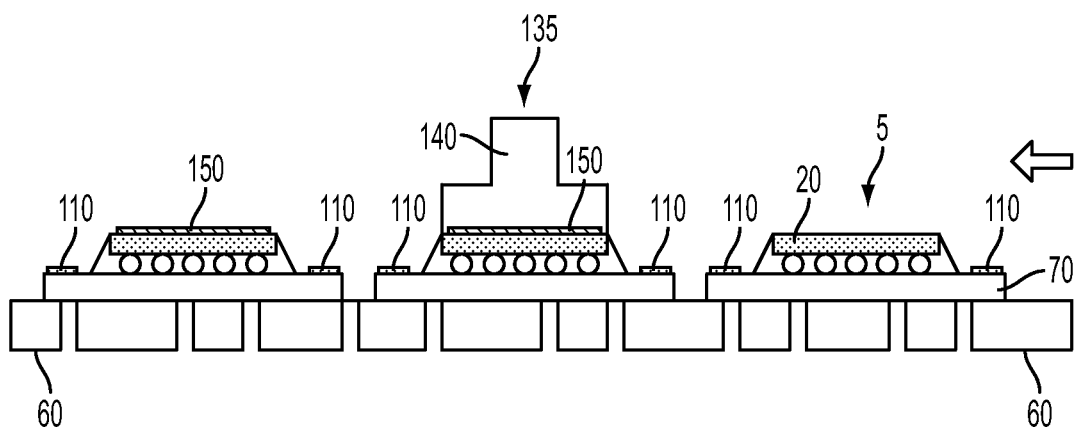
FIG. 3a is a cross-sectional view of the semiconductor package of FIG. 2a showing a further step of applying a thermal interface material (TIM) on top of the die, according to aspects of the present disclosure.
Figure 4:
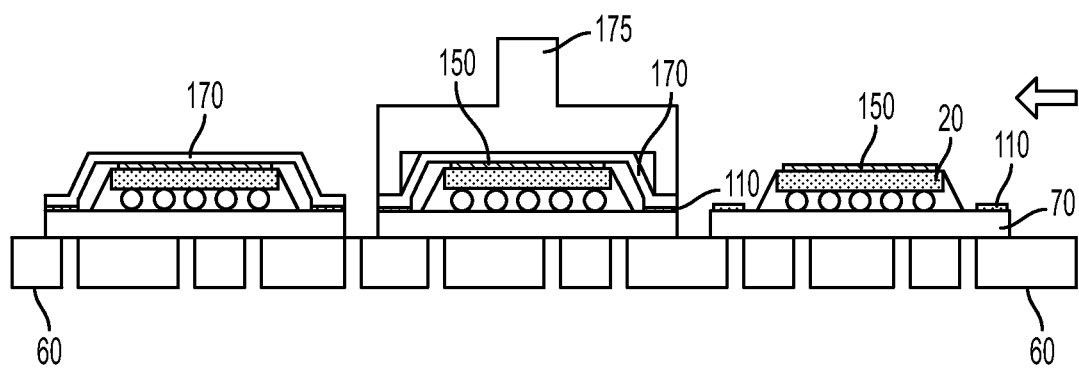
FIG. 4 is a cross-sectional view of the semiconductor package of FIG. 3a showing the package undergoing a further step of attaching a lid to the substrate, according to aspects of the present disclosure.

FIGS. 2a, 3a, and 4 are cross-sectional side views of a semiconductor package 5 at various stages of fabrication undergoing a lid attach process, according to an embodiment of the present disclosure. The semiconductor package 5 placed on a supporting boat or carrier 60 undergoes a lid attach process starting from a right side going to a left, as indicated by an arrow pointing to the left in these figures. It is understood that FIGS. 2a, 3a, and 4 have been simplified for a better understanding of the inventive concepts of the present disclosure. FIG. 2a shows semiconductor package 5 having a die 20 (such as a microprocessor, a chipset, a memory device, an ASIC, any heat generating device, or the like), illustrated as a flip-chip attached to a substrate 70, which may be a motherboard, interposer, a back surface of another dice, or the like. Die 20 may comprise of one or more dies. By way of a die-attach process, die 20 is attached to substrate 70 by interconnects 90, such as solder bumps or solder balls. An underfill 100, as known in the art, may be disposed between die 20, interconnects 90, and the substrate 70 to strengthen the semiconductor package 5, prevent bump cracks, and/or enhance thermal dissipation of package.

Figure 2B:
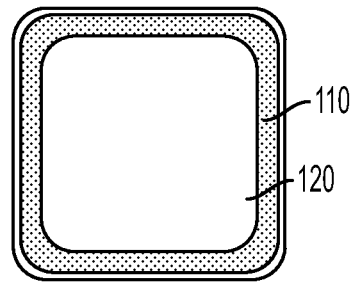
FIG. 2b is a side view of a stamp-type dispensing head of an adhesive dispenser, according to one embodiment of the present disclosure.
Figure 2C:
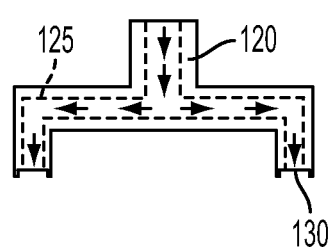
FIG. 2c is a bottom view of the stamp-type dispensing head of FIG. 2b, according to one embodiment of the present disclosure.

According to an aspect of the present disclosure, an adhesive material 110 is dispensed on the substrate 70. Adhesive material 110 may comprise any material suitable for sealing a lid onto substrate 70, such as epoxies, urethane, polyurethane, silicone elastomers, and the like. In one embodiment, adhesive material 110 is a wet-dispensed adhesive such as SYLGARD® 577, EA6700 or EA6900 all produced by Dow Corning (Midland, Mich., USA). The adhesive material 110 is generally wet dispensed to an outer portion or a periphery or edges of substrate 70 by means of an adhesive dispenser 115 having a stamp-type dispensing head 120. FIG. 2b is a side view of the stamp-type dispensing head 120 of adhesive dispenser 115, and FIG. 2c is a bottom view of the stamp-type dispensing head 120 showing adhesive material 110 attached to the stamp-type dispensing head 120, according to one embodiment of the present disclosure. The adhesive material 110 attached to the stamp-type dispensing head 120 may include a contiguous or non-contiguous pattern, as is understood by those skilled in the art. The adhesive dispenser 115 includes a container (not shown), such as a syringe for storing the adhesive material 110 and the stamp-type dispensing head 120 includes one or more conduits 125. By an interaction force, such as for example, a pump extrusion force or a rotary pump extrusion force, the adhesive material 110 is pumped from the syringe into the one or more conduits (adhesive material 110 flow shown by arrows) and out through the orifice(s) 130 for application to substrate 70. It is understood that the conduits 125 may be arranged in the stamp-type dispensing head 120 differently from the one(s) shown in FIG. 2b and that any number of arrangements may be contemplated.

Following application of the adhesive material 110 to the substrate 70, FIG. 3a shows the semiconductor package 5 undergoing a further step of applying a thermal interface material (TIM) 150 to the top of die 20, according to aspects of the present disclosure. The thermal interface material 150 may include but is not limited to, thermal grease, phase-change material, metal filled polymer matrix, and solder [alloys of lead, tin, indium, silver, copper, bismuth, and the like (most preferred is indium or lead/tin alloy]). If the thermal interface material 150 is a solid, it may be heated to a temperature at which it undergoes a solid to liquid transition and then may be applied in liquid form to the surface of a die.

Figure 3B:
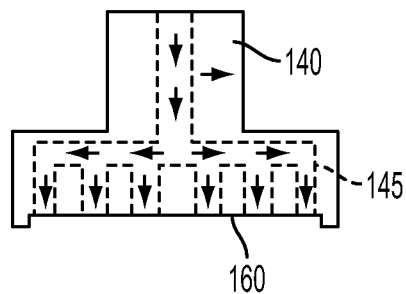
FIG. 3b is a side view of a stamp-type dispensing head of a TIM dispenser, according to an embodiment of the present disclosure.
Figure 3C:
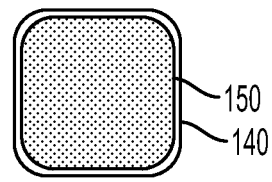
FIG. 3c is a bottom view of the stamp-type dispensing head of FIG. 3b, according to one embodiment of the present disclosure.
Figure 7:
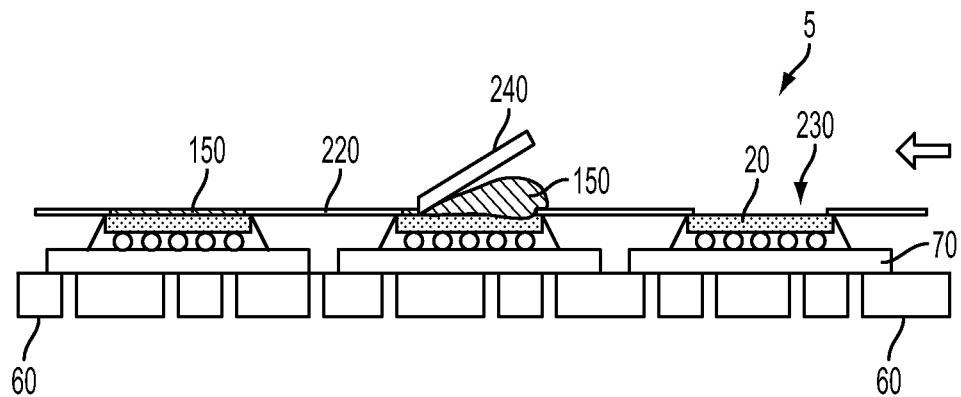
FIG. 7 is a cross-sectional view of a semiconductor package undergoing a lid attachment process where TIM is applied to a top of a die by stencil printing, according to various aspects of the present disclosure.

According to one embodiment of the present disclosure, the TIM 150 is generally wet-dispensed to the top of die 20 by means of a TIM dispenser 135 having a stamp-type dispensing head 140. FIG. 3b is a side view of the stamp-type dispensing head 140 of TIM dispenser 135, and FIG. 3c is a bottom view of the stamp-type dispensing head 140 showing TIM 150 attached to the stamp-type dispensing head 140, according to an embodiment of the present disclosure. The TIM dispenser 135 includes a container (not shown), such as a syringe for storing the TIM 150 and the stamp-type dispensing head 140 includes one or more conduits 145. By an interaction force, such as for example, a pump extrusion force or a rotary pump extrusion force the TIM 150 is pumped from the syringe into the one or more conduits (TIM flow shown by arrows) and out through the one ore more orifices 160 for application to a top surface of die 20. It is understood to one of ordinary skill in the art that the conduits 145 may be arranged in the stamp-type dispensing head 140 differently the one(s) shown in FIG. 3b and that any number of arrangements may be contemplated. According to another embodiment, TIM 150 may be applied to a top surface of die 20 by means of stencil printing. FIG. 7 shows semiconductor package 5 undergoing a process of stencil printing whereby, in a first step a stencil 220 is placed over the top surface of the die 20, the stencil 220 having a patterned opening 230 therein. The stencil 220 is a thin flat material, such as stainless steel that has one or more openings or apertures through which TIM 150 is applied or printed. It is understood that any number of stencils, for the application of forming TIM 150 on top of die 20 may be used and any number of patterned openings 230 may be contemplated. In a second step, TIM 150 is deposited, preferably in liquid form on top of die 20 in the opening 230 of stencil 220. In a third step, excess TIM 150 is squeezed or otherwise scraped off from the opening 230 by a blade or scraper 240 in order to form a generally flat TIM 150, the generally flat TIM 150 being adapted to interface with a lid that is to be later placed on top of TIM 150. In a fourth step, the stencil 220 is removed from the top surface of die 20. An advantage of applying TIM 150 on die 20 in this manner is that TIM 150 may be formed on a batch of dies at the same time. Batch processing of TIM saves time, increases throughput, and forms uniform TIM dispensing layers when compared to other types of TIM dispensing processes, such as needle-type dispensing.

After the TIM 150 is applied to die 20, semiconductor package 5 undergoes a further step of attaching a lid 170 to the substrate 70 (as depicted in FIG. 4). Lid 170 is preferably constructed from a thermally conductive material, such as copper, copper alloys, aluminum, aluminum alloys, and the like and may be formed of any other suitable materials for application of the present disclosure. As shown in FIG. 4, lid 170 is positioned over die 20, lowered and thereafter placed on top of the adhesive material 110 and on top of the TIM 150 by a lid carrier 175, to thereby encapsulate and protect the die 20. It is understood that additional processes may be performed before, during, or after the adhesive and/or TIM application processes to complete the fabrication of the semiconductor device, but these additional processes are not discussed herein in detail for the sake of simplicity. For example, heat may be applied to the semiconductor package 5 to cure the structure by increasing the temperature of the TIM 150 and the adhesive material 110.

Figure 5A:
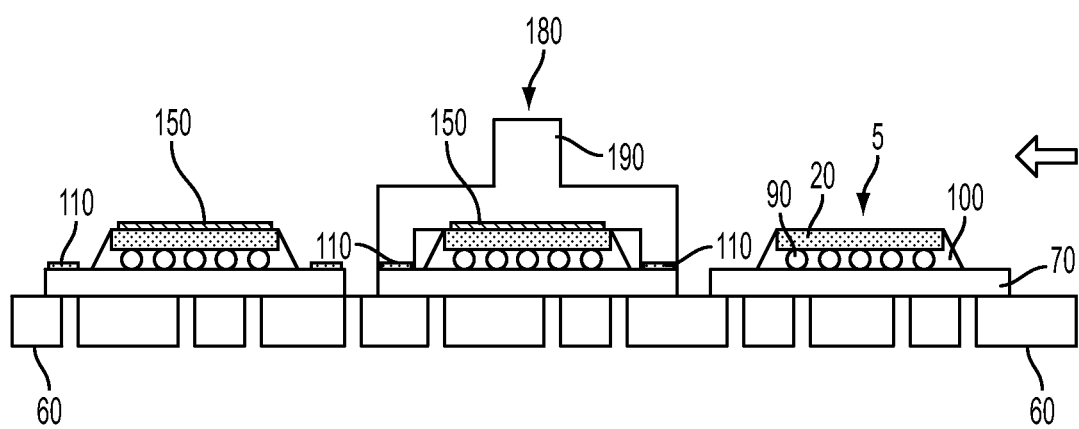
FIG. 5a is a cross-sectional view of a semiconductor package depicting a die attached to a substrate undergoing a stage of lid attachment where an adhesive material and a TIM are concurrently applied to the substrate and the die, respectively, according to aspects of the present disclosure.
Figure 6:
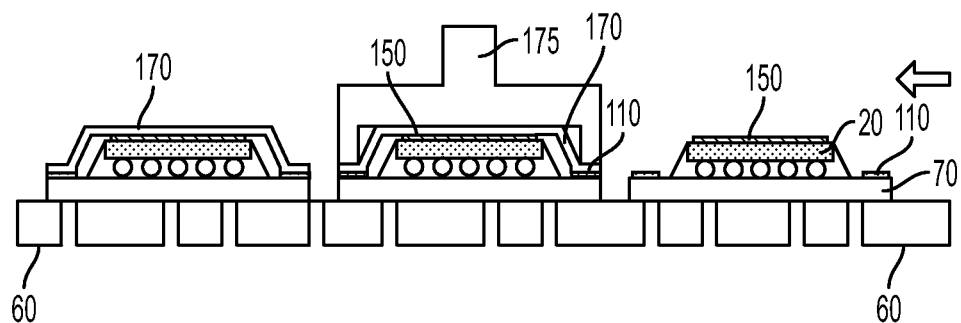
FIG. 6 is a cross-sectional view of the semiconductor package of FIG. 5a showing the package undergoing a further step of attaching a lid to the substrate, according to aspects of the present disclosure.

FIGS. 5a and 6 are cross-sectional side views of the semiconductor package 5 at various stages of fabrication undergoing a lid attach process, according to another embodiment of the present disclosure. As discussed previously, the semiconductor package 5 is placed on the supporting boat or carrier 60 and undergoes the lid attach process starting from a right side and going to a left side, as shown by an arrow pointing to the left. It is understood that FIGS. 5a and 6 have been simplified for a better understanding of the inventive concepts of the present disclosure.

Figure 5B:
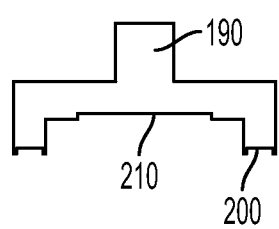
FIG. 5b is a side view of a stamp-type dispensing head of a combination adhesive and TIM dispenser, according to an embodiment of the present disclosure.
Figure 5C:
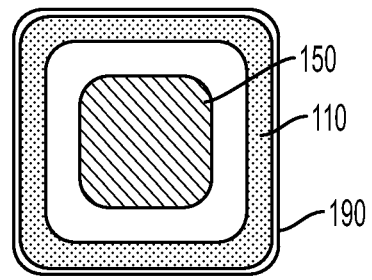
FIG. 5c is a bottom view of the stamp-type dispensing head of FIG. 5b, according to one embodiment of the present disclosure.

In this embodiment, an adhesive material 110 and a TIM 150 are applied concurrently onto a periphery of the substrate 70 and a top surface of die 20, respectively by a combination adhesive and TIM dispenser 180 having a stamp-type dispensing head 190. FIG. 5b is a side-view of the stamp-type dispensing head 190 of the combination adhesive and TIM dispenser 180, and FIG. 5c is a bottom view of the stamp-type dispensing head 190 showing both adhesive material 110 and TIM 150 attached to the stamp-type dispensing head 190, according to an embodiment of the present invention. The combination adhesive and TIM dispenser 180 includes a container (not shown), such as a syringe for storing the adhesive material 110 and TIM 150 and the stamp-type dispensing head 190 includes one or more conduits (not shown for simplicity and clarity). By an interaction force, such as for example, a pump extrusion force or a rotary pump extrusion force the adhesive material 110 and TIM are dispensed or pumped from the container or syringe into the respective conduits and out through orifice 200 and orifice 210 for application to substrate 70 and die 20, respectively. It is understood that the conduits may be arranged in the stamp-type dispensing head 190 in any number of configurations contemplated.

Following application of the adhesive material 110 to the substrate 70 and TIM 150 to the die 20, FIG. 6 shows the semiconductor package 5 undergoing a further step of attaching a lid 170 to the substrate 70. Lid 170 is positioned over die 20, lowered and thereafter placed on top of the adhesive material 110 and TIM 150 by a lid carrier 175 to thereby encapsulate the die 20.

Figure 8:
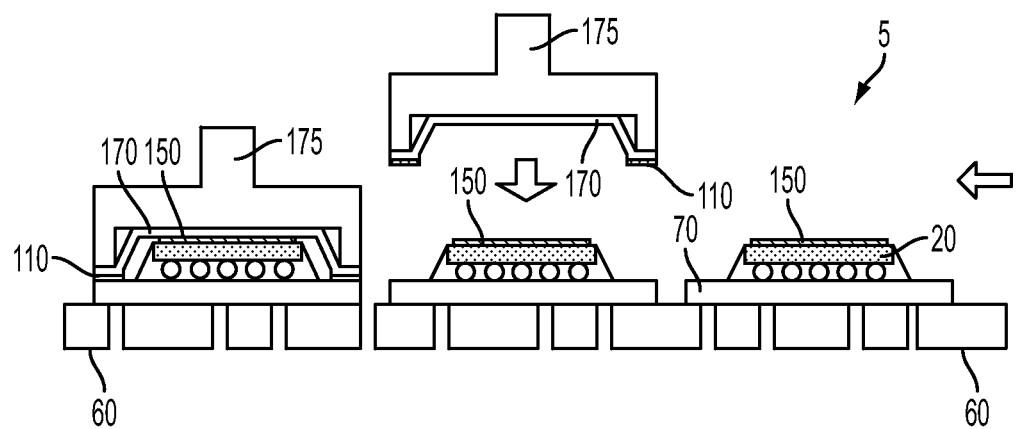
FIG. 8 is a cross-sectional view of a semiconductor package undergoing a lid attachment process where adhesive material is attached to the substrate by way of dipping a periphery of a lid in adhesive material and then attaching the lid to the substrate, according to various aspects of the present disclosure.
Figure 9:
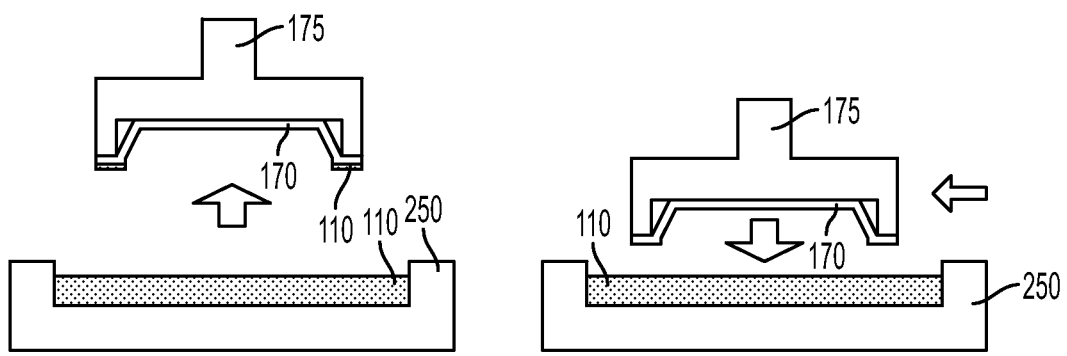
FIG. 9 is a cross-sectional view showing a process of dipping a lid, attached to a lid carrier into a dipping tank in order to apply adhesive material to the periphery of the lid, according to one embodiment of the present disclosure.

FIG. 8 is a cross-sectional side view of the semiconductor package 5 at various stages of fabrication undergoing a lid attach process, according to yet another embodiment of the present disclosure. TIM 150 is firstly applied on a top surface of die 20. According to one embodiment, TIM 150 is applied to die 20 by a TIM dispenser 135 having a stamp-type dispensing head 140. According to another embodiment, TIM 150 is applied to die 20 by a stencil printing process. As this process was described above with reference to FIG. 7, it will not be repeated again. In a further process of applying the adhesive material 110 to substrate 70, as shown in FIG. 9 the periphery of a lid 170, which is attached to a lid carrier 175 is dipped in a dipping tank 250 containing adhesive material 110. The adhesive material 110 thereby attaches to the periphery of the lid 170. With reference back to FIG. 8, lid 170 now containing the adhesive material attached to the periphery thereof is then positioned over die 20, lowered and thereafter placed on top of TIM 150 and substrate 70 with the adhesive material 110 being adapted to interface with the periphery of the substrate 70.

Advantages of one or more embodiments of the present disclosure may include one or more of the following.

In one or more embodiments, instead of dispensing complicated TIM patterns on the die, simple and more straightforward patterns can be dispensed on the die. This decreases the time needed to apply a complicated dispensing pattern thereby increasing the throughput of the assembly process.

In one or more embodiments of the present disclosure, employing a stamp-type dispensing head to dispense a layer, such as an adhesive layer a more uniform dispensing layer can be achieved, providing for more sufficient adhesive coverage on the substrate.

In one or more embodiments of the present disclosure, both the adhesive and TIM dispensing processes are combined into a single step, thereby saving time and increasing throughput.

In one or more embodiments of the present disclosure, an advantage of applying the TIM on a die employing stencil printing permits the TIM to be formed on a batch of dies at the same time. Batch processing of TIM saves time, increases throughput, and forms uniform TIM dispensing layers when compared to other types of TIM dispensing processes, such as needle-type dispensing.

Although much of the description herein is directed to the dispensing of adhesive material and/or thermal interface material on a semiconductor package in a lid attach process, it is to be understood that aspects of the present disclosure may apply broadly to the dispensation of the adhesive material and/or thermal interface material or, for that matter, any other like material in a package structure from which one may want to attach and/or assemble components in package structures.

The present disclosure has described various exemplary embodiments.

According to one embodiment, a semiconductor package assembly process, comprises attaching one or more dies to a substrate; applying an adhesive material on a periphery of the substrate by an adhesive dispenser; applying a TIM on a top surface of the die; and positioning a lid over the one or more dies and placing the lid on top of the adhesive material and the TIM by a lid carrier to encapsulate the one or more dies.

According to another embodiment, a semiconductor package assembly process, comprises attaching one or more dies to a substrate; applying concurrently an adhesive material on a periphery of the substrate and a TIM on a top surface of the die by a combination adhesive and TIM dispenser; and positioning a lid over the one or more dies and placing the lid on top of the adhesive material and the TIM by a lid carrier to encapsulate the one or more dies.

According to yet another embodiment, a lid attach process, comprises attaching one or more dies to a substrate; applying a TIM on a top surface of the die; providing a lid and dipping the periphery of the lid by a lid carrier in a dipping tank of adhesive material such that the adhesive material attaches to the periphery of the lid; and positioning the lid over the one or more dies and placing the lid on the top of the TIM with the adhesive material being adapted to interface with the periphery of the substrate.

According to yet another embodiment, an adhesive dispenser comprises a stamp-type dispensing head for applying an adhesive material to a substrate, the adhesive dispenser having a container for storing the adhesive material and one or more conduits in the stamp-type dispensing head for dispensing the adhesive material therethrough by a pump extrusion force.

According to yet another embodiment, a TIM dispenser comprises a stamp-type dispensing head for applying a TIM to a die, the TIM dispenser having a container for storing the TIM and one or more conduits in the stamp-type dispensing head for dispensing the TIM from the container and through the one or more conduits by a pump extrusion force.

According to yet another embodiment, a combination adhesive and TIM dispenser comprises a stamp-type dispensing head for applying an adhesive material to a substrate and a TIM to a die, the combination dispenser having a container for storing the adhesive material and/or TIM, and one or more conduits in the stamp-type dispensing head for dispensing the adhesive material and/or TIM from the container and through the one or more respective conduits by a pump extrusion force.

An aspect of this description relates to an adhesive dispenser comprises a dispensing head. The dispensing head comprises an adhesive material applicator portion on a first level of the dispensing head. The adhesive material applicator portion corresponds to a periphery of a package. The dispensing head also comprises a thermal interface material (TIM) applicator portion on a second level of the dispensing head different from the first level. The TIM applicator portion corresponds to a die of the package. The dispensing head further comprises an adhesive material conduit configured to supply the adhesive material applicator portion with an adhesive material. The dispensing head additionally comprises a TIM conduit configured to supply the TIM applicator portion with a TIM.

Another aspect of this description relates to a combination adhesive and thermal interface material (TIM) dispenser. The dispenser comprises a stamp-type dispensing head configured to apply (1) an adhesive material to a periphery of a surface of a substrate and (2) a TIM to a top surface of a die attached to the surface of the substrate. The dispenser also comprises an adhesive material conduit configured to supply an adhesive material applicator portion of the stamp-type dispensing head with the adhesive material. The dispenser further comprises a TIM conduit configured to supply a TIM applicator portion of the stamp-type dispensing head with the TIM.

A further aspect of this description relates to a dispensing head comprising a first applicator region having an adhesive material applicator portion. The dispensing head also comprises a second applicator region having a thermal interface material (TIM) applicator portion. The dispensing head further comprises an adhesive material conduit configured to supply the adhesive material applicator portion with adhesive material. The dispensing head additionally comprises a TIM conduit configured to supply the TIM applicator portion with TIM. The dispensing head is configured to apply (1) the adhesive material to a periphery of a surface of a substrate using the adhesive material applicator portion and (2) the TIM to a top surface of a die attached to the surface of the substrate using the TIM applicator portion. The first applicator region and the second applicator region are arranged to accommodate the die within a cavity between the first applicator region and the second applicator region.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. An adhesive dispenser, comprising:
    a dispensing head comprising:
        an adhesive material applicator portion on a first level of the dispensing head, the adhesive material applicator portion corresponding to an entirety of a periphery of the dispensing head;
        a thermal interface material (TIM) applicator portion on a second level of the dispensing head different from the first level, the TIM applicator portion corresponding to a center of the dispensing head;
        an adhesive material conduit configured to supply the adhesive material applicator portion with an adhesive material; and
        a TIM conduit configured to supply the TIM applicator portion with a TIM.

2. The adhesive dispenser of claim 1, further comprising:
    a TIM container from which the TIM is supplied to the TIM applicator portion from the TIM container through the TIM conduit.

3. The adhesive dispenser of claim 1, further comprising:
    an adhesive material container from which the adhesive material is supplied to the adhesive material applicator portion through the adhesive material conduit.

4. The adhesive dispenser of claim 3, wherein the adhesive material container is a syringe configured to pump the adhesive material into the adhesive material conduit.

5. The adhesive dispenser of claim 2, wherein the TIM container is a syringe configured to pump the TIM into the TIM conduit.

6. The adhesive dispenser of claim 1, wherein the dispensing head is a stamp-type dispensing head.

7. The adhesive dispenser of claim 1, wherein the dispensing head further comprises:
    a plurality of orifices configured to output the adhesive material.

8. The adhesive dispenser of claim 1, wherein the dispensing head further comprises:
    a plurality of orifices configured to output the TIM.

9. The adhesive dispenser of claim 1, wherein the dispensing head is configured to concurrently apply the adhesive material and the TIM.

10. A combination adhesive and thermal interface material (TIM) dispenser, comprising:
    a stamp-type dispensing head configured to concurrently apply (1) an adhesive material to a two-dimensional arrangement of locations around a periphery of a surface of a substrate and (2) a TIM to a top surface of a die attached to the surface of the substrate, wherein the adhesive material and the TIM are different compositions;
    an adhesive material conduit configured to supply an adhesive material applicator portion of the stamp-type dispensing head with the adhesive material; and a TIM conduit configured to supply a TIM applicator portion of the stamp-type dispensing head with the TIM.

11. The combination adhesive and TIM dispenser of claim 10, further comprising:
a TIM container from which the TIM is supplied to the TIM applicator portion through the TIM conduit.

12. The combination adhesive and TIM dispenser of claim 10, further comprising:
an adhesive material container from which the adhesive material is supplied to the adhesive material applicator portion through the adhesive material conduit.

13. The combination adhesive and TIM dispenser of claim 12, wherein the adhesive material container is a syringe configured to pump the adhesive material into the adhesive material conduit.

14. The combination adhesive and TIM dispenser of claim 11, wherein the TIM container is a syringe configured to pump the TIM into the TIM conduit.

15. The combination adhesive and TIM dispenser of claim 10, wherein the dispensing head further comprises:
a plurality of orifices configured to output the adhesive material.

16. The combination adhesive and TIM dispenser of claim 10, wherein the dispensing head further comprises:
a plurality of orifices configured to output the TIM.

17. A dispensing head, comprising:
a first applicator region having an adhesive material applicator portion;
a second applicator region having a thermal interface material (TIM) applicator portion;
an adhesive material conduit configured to supply the adhesive material applicator portion with adhesive material; and
a TIM conduit configured to supply the TIM applicator portion with TIM,
wherein
the dispensing head is configured to apply (1) the adhesive material to a periphery of a surface of a substrate using the adhesive material applicator portion and (2) the TIM to a top surface of a die attached to the surface of the substrate using the TIM applicator portion, and
the first applicator region and the second applicator region are arranged to accommodate the die within a cavity between the first applicator region and the second applicator region.

18. The dispensing head of claim 17, further comprising:
a plurality of first orifices configured to output the adhesive material; and
a plurality of second orifices configured to output the TIM.

19. The dispensing head of claim 17, wherein the dispensing head is configured to concurrently apply the adhesive material and the TIM.

20. The combination adhesive and TIM dispenser of claim 10, wherein the two-dimensional arrangement of locations has the shape of a rectangle.

* * * * *